US012596165B2

(12) United States Patent
Patel et al.

(10) Patent No.: US 12,596,165 B2
(45) Date of Patent: Apr. 7, 2026

(54) SYSTEM AND METHODS FOR GROUND FAULT THRESHOLD CALIBRATION USING SELF-TEST CIRCUIT

(71) Applicant: ABB Schweiz AG, Baden (CH)

(72) Inventors: Hetul S. Patel, Waterford, CT (US); Gregory L. Jones, Lagrange, KY (US)

(73) Assignee: ABB Schweiz AG, Baden (CH)

( * ) Notice: Subject to any disclaimer, the term of this patent is extended or adjusted under 35 U.S.C. 154(b) by 246 days.

(21) Appl. No.: 18/454,522

(22) Filed: Aug. 23, 2023

(65) Prior Publication Data

US 2025/0067830 A1    Feb. 27, 2025

(51) Int. Cl.
*G01R 35/00* (2006.01)
*G01R 31/52* (2020.01)
(52) U.S. Cl.
CPC ........... *G01R 35/005* (2013.01); *G01R 31/52* (2020.01)
(58) Field of Classification Search
USPC ....................................................... 324/509
See application file for complete search history.

(56) References Cited

U.S. PATENT DOCUMENTS 8,085,516 B1    12/2011  Armstrong
11,112,453 B2*   9/2021  Ostrovsky .............. H02H 3/335

* cited by examiner

*Primary Examiner* — Farhana A Hoque
(74) *Attorney, Agent, or Firm* — Fitch Even Tabin & Flannery LLP

(57) ABSTRACT

A system for calibrating ground fault threshold using auto-monitoring circuit, the system is provided. The system includes a circuit board comprising a self-injection circuit, a rectified voltage detection circuit, and a controller. The controller is configured to provide, using the self-injection circuit, a trigger pulse as input to the self-injection circuit. The rectified voltage detection circuit is used to measure a rectified voltage from the current transformer, where the rectified voltage is based on an AC voltage powering the circuit board. Based on the rectified voltage a series resistor in a current path, an expected current through the current transformer is determined. The expected current is converted to a digital value using an analog to digital converter. A tolerance level of the current transformer is determined based on the digital value.

20 Claims, 5 Drawing Sheets

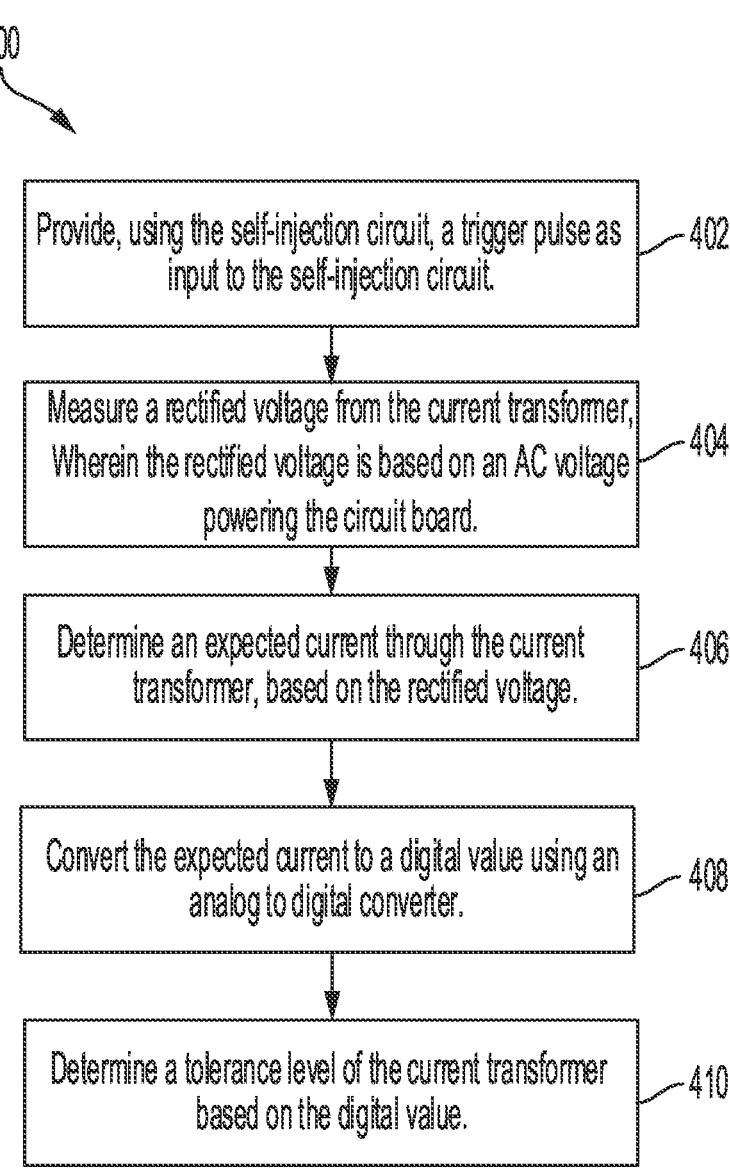

400

Provide, using the self-injection circuit, a trigger pulse as input to the self-injection circuit. —— 402

Measure a rectified voltage from the current transformer, Wherein the rectified voltage is based on an AC voltage powering the circuit board. —— 404

Determine an expected current through the current transformer, based on the rectified voltage. —— 406

Convert the expected current to a digital value using an analog to digital converter. —— 408

Determine a tolerance level of the current transformer based on the digital value. —— 410

FIG. 4

SYSTEM AND METHODS FOR GROUND FAULT THRESHOLD CALIBRATION USING SELF-TEST CIRCUIT

FIELD

The present disclosure relates to a method and system for ground fault threshold calibration.

BACKGROUND

It is important, in existing auto-monitoring requirements, to periodically test the health of a current transformer, including the signal path to an analog-to-digital signal convertor. Conventional systems and methods for ground-fault threshold calibration are bulky and costly, and require externally calibrated equipment, such as a voltage source and a current source. There is a need for a system and methods to calibrate ground-fault threshold without using externally calibrated equipment.

SUMMARY

A first aspect of the present disclosure provides a system for calibrating ground fault threshold using auto-monitoring circuit. The system comprises: a circuit board comprising a self-injection circuit, the current transformer, a rectified voltage detection circuit, and a controller configured to: provide, using the self-injection circuit, a trigger pulse as input to the self-injection circuit; measure, using the rectified voltage detection circuit, a rectified voltage, wherein the rectified voltage is based on an AC voltage powering the circuit board; determine an expected current through the current transformer, based on the rectified voltage and a series resistor in a current path; convert the expected current to a digital value using an analog to digital converter; and determine a tolerance level of the current transformer based on the digital value.

According to an implementation of the first aspect, the controller is further configured to: determine a ground fault current value after the circuit board is powered on; compare the tolerance level of the current transformer to the determined ground fault current value; and provide a trip signal to a circuit breaker by actuating a solenoid based on the comparison.

According to an implementation of the first aspect, converting the expected current to a digital value comprises calculating a least significant bit (LSB) count associated with the output current.

According to an implementation of the first aspect, determining the tolerance level of the current transformer comprises: determining a unitary LSB count associated with one milliampere of expected current; and determining a tolerance LSB associated with five milliamperes of expected current based on the unitary LSB count.

According to an implementation of the first aspect, the controller is configured to provide the trip signal to trip the circuit breaker by actuating the solenoid upon detecting an LSB count greater than the tolerance LSB count.

According to an implementation of the first aspect, the expected current is current that goes through a primary of the current transformer is considered as a leakage based on determining that the expected current does not return through the current transformer.

According to an implementation of the first aspect, the trigger pulse comprises a half-cycle of alternating current (AC).

According to an implementation of the first aspect, the trigger pulse is applied at regular time intervals.

According to an implementation of the first aspect, calculating the tolerance level of the current transformer comprises calculating a room-mean-square tolerance value using multiple determined tolerance levels.

According to an implementation of the first aspect, the self-injection circuit comprises a rectifier and a bipolar junction transistor, and wherein the current transformer is connected to a source terminal of the bipolar junction transistor and the rectifier is connected to a drain terminal of the bipolar junction transistor.

A second aspect of the present disclosure provides a method for calibrating ground fault threshold using auto-monitoring circuit, the method comprising: providing, using a self-injection circuit, a trigger pulse input to the self-injection circuit; measuring a rectified voltage, wherein the rectified voltage is based on an AC voltage powering the circuit board; determining an expected current through the current transformer, based on the rectified voltage and a series resistor in a current path; converting the expected current to a digital value using an analog to digital converter; and determining a tolerance level of the current transformer based on the digital value.

A third aspect of the present disclosure provides a non-transitory computer-readable medium having processor-executable instructions stored thereon. The processor-executable instructions, when executed by one or more processors, facilitate: providing, using a self-injection circuit, a trigger pulse input to the current transformer; detecting an output voltage from the current transformer; determining an expected current through the current transformer, based on the output voltage; converting the expected current to a digital value using an analog to digital converter; and determining a tolerance level of the current transformer based on the digital value.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 4 is a flow chart of an exemplary process for calibrating a ground-fault threshold, according to one or more examples of the present disclosure.

DETAILED DESCRIPTION

As part of auto-monitoring test requirements, periodic testing of current transformers is performed. Testing of current transformers includes testing of current transformer health and a signal path from the current transformer to an Analog-to-Digital (ADC) convertor. In some embodiments, testing of current transformers includes determining various parameters associated with the functioning of current transformers and comparing them to their respective thresholds. Calibration of current transformer and associated signal path for ground fault detection is time consuming, resource intensive, and performed using externally calibrated equipment, such as voltage and current sources.

The present disclosure provides a system and method for ground-fault threshold calibration using a ground-fault self-test circuit that uses existing circuit elements without externally calibrated equipment. A half-cycle of alternating current (AC) is injected through the primary of current transformer, and an output is measured at the secondary of current transformer. The measured output of the current transformer is compared to a threshold to determine if the measured output falls within a range.

Figure 1:
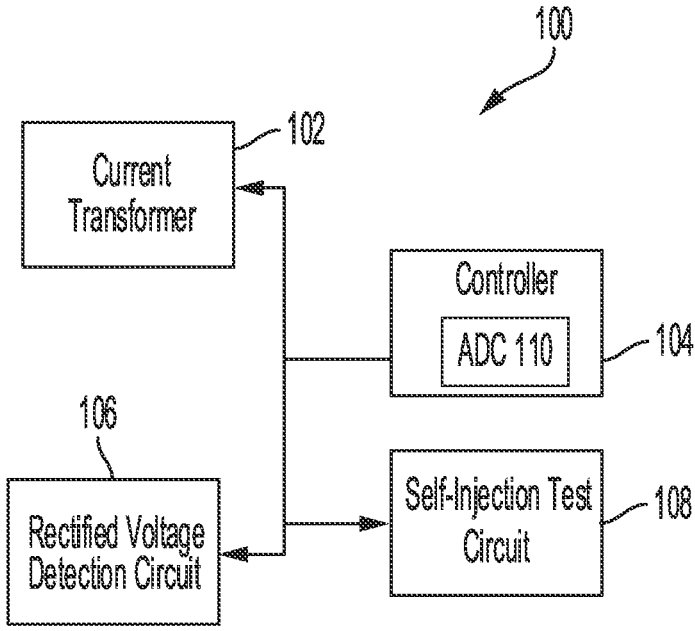
FIG. 1 illustrates a simplified block diagram depicting a system for calibrating a ground-fault threshold, according to one or more examples of the present disclosure.

FIG. 1 illustrates a simplified block diagram depicting a system for calibrating ground-fault thresholds, according to one or more examples of the present disclosure. System 100 of FIG. 1 depicts elements of a circuit according to an embodiment of the present disclosure. In particular, the circuit represented by system 100 includes a current transformer 102, a controller 104, a rectified voltage detection circuit 106, and self-injection test circuit 108. The controller 104 may be calibrated to detect a health of the current transformer 102. For example, calibration of the current transformer 102 and associated signal path for ground fault detection includes determining the functioning of the various components of the current transformer 102 based on output values received from the current transformer 102. In some embodiments, the path of the current transformer 102 is calibrated using a value of ground-fault current output from the current transformer 102 that is provided to controller 102 via the current path that connects the current transformer 102 to the controller 104.

In order to be able to calibrate the current transformer 102, the controller 104 may initiate a calibration of a ground-fault threshold of the current transformer 102 by using the self-injection test circuit 108. In some embodiments, the controller 104 may instruct the self-injection test circuit 108 to inject a trigger pulse to the current transformer 102. As part of the trigger pulse, the self-injection test circuit 108 may inject a half-cycle of AC through the current transformer 102. The injection of the half-cycle of AC through the current transformer 102 induces the current transformer 102 to generate an output voltage on the secondary side. The output voltage from the current transformer 102 is measured using the ADC 110 of controller 104. In some embodiments, the rectified voltage detection circuit 106 determines the rectified AC voltage applied to the circuit represented by system 100 of FIG. 1. In some embodiments, the controller 104 calculates the rectified AC voltage based on the voltage measured by the rectified voltage detection circuit 106. The voltage measured by the rectified voltage detection circuit 106 is a scaled version of the rectified AC voltage. The controller 104 may be able to determine the actual rectified AC voltage from the voltage detected by the rectified voltage detection circuit 106 using the voltage divider formula. In some embodiments, the rectified voltage is used to calculate expected current through the current transformer 102 when a ground-fault self-test is initiated. For example, the controller 104 may calculate the expected current through the current transformer 102 using a value of a resistance that is part of the self-injection circuit and the rectified AC voltage, when the ground-fault test is initiated. In some embodiments, the expected current may be considered a leakage current of the current transformer 102 if it goes through primary of the current transformer and does not return through current transformer. The controller 104 normalizes the expected current for 5 mA. In some embodiments, the process of normalization of the expected current includes converting the expected current to a digital value using an analog-to-digital converter (ADC) 110 that is part of the controller 104. For example, the ADC 110 of the controller 104 may convert the expected current to a count of a least significant bit (LSB) value. The LSB count of the expected current is then normalized to a normalized LSB count corresponding to a current value of 5 mA.

In some embodiments, the normalized LSB count is established as a ground fault threshold and programmed into controller 102. In some embodiments, in order to obtain a ground fault threshold, the controller 104 injects several half-cycles of AC through the current transformer 102 and determines various normalized LSB counts corresponding to an expected current value of 5 mA. A root-mean-square value of the various normalized LSB counts is calculated to determine the ground fault threshold of the current transformer 102. In some embodiments, the ground fault threshold of the current transformer 102 is stored in a memory associated with the controller 104.

In some examples, once the controller 104 is calibrated for ground fault detection, every time the board, of which the current transformer 102 is a part, is turned on, current through the current transformer 102 is processed at the controller 104 and compared with the ground fault threshold. For example, when the board is turned on, leakage current is measured with the current transformer 102 and provided to controller 104. The measured value of output current at the current transformer is converted to an output LSB count using the ADC 110 of controller 104. In case the output LSB count is greater than the ground fault threshold LSB count, the controller 104 provides a trip signal to a circuit breaker by actuating a solenoid based on the comparison. In case the runtime LSB count of the calculated current is lesser than the ground fault threshold, the controller 104 does not send a signal to ground fault current transformer 102 and continues to monitor the leakage current and compare to the ground fault threshold periodically.

In some cases, the normalized LSB count acts as a better ground fault threshold, than a fixed value LSB count, because the fixed value may be different for different circuit boards given the tolerances of the current transformer and the signal conditioning circuits. By using a normalized LSB count as a ground fault threshold instead of a fixed value, the system 100 is able to accurately account for a consistent ground fault currents, without focusing of the variation in the output of the current transformer 102 from sample to sample. In some embodiments, calibration of the controller 104 to detect ground fault helps with variability on current transformer sample to sample variation across different breakers.

Figure 2A:
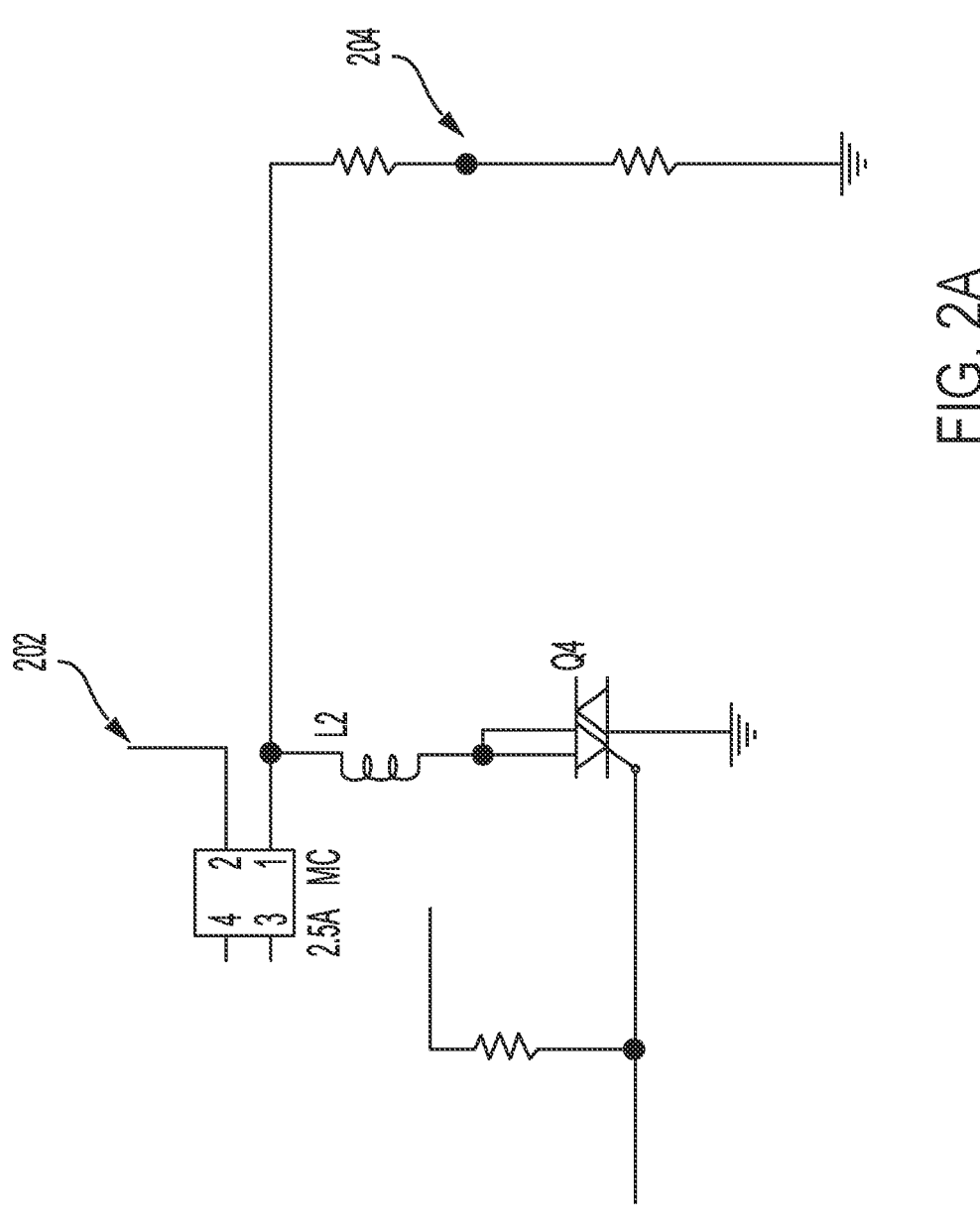
FIGS. 2A-2B are simplified circuit diagrams for calibrating a ground-fault threshold, according to one or more examples of the present disclosure.
Figure 2B:
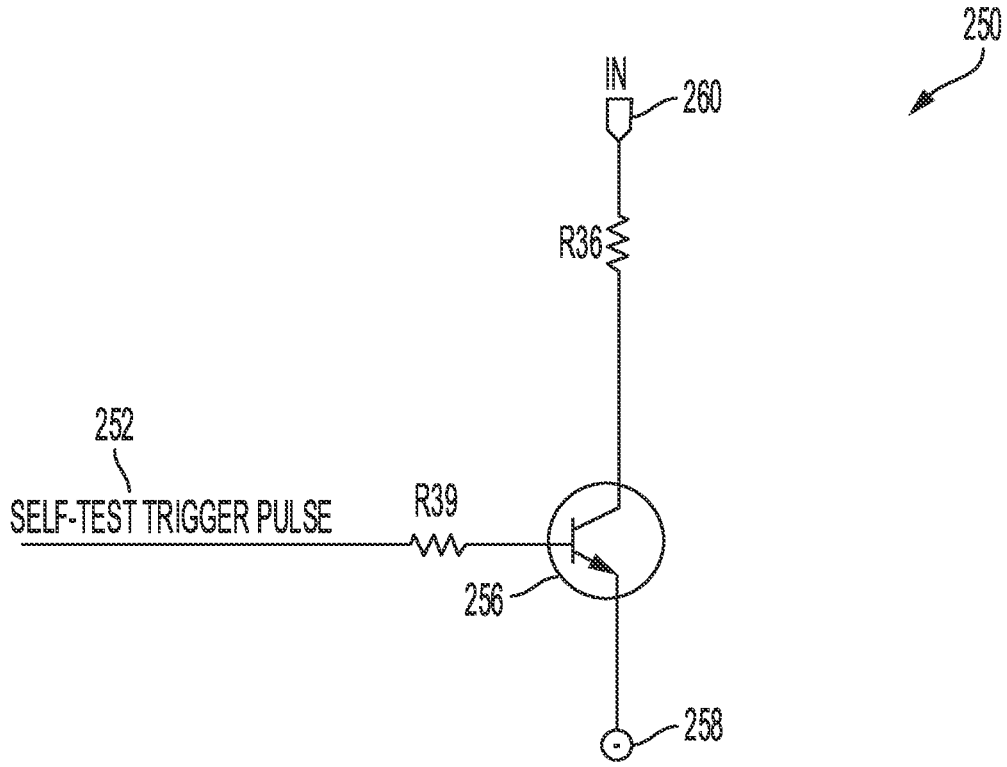

FIGS. 2A-2B depicts a portion of circuit diagram for calibrating a ground-fault threshold, according to one or more examples of the present disclosure.

FIG. 2A depicts a rectified voltage detection circuit 200. Rectified voltage detection circuit 200 is similar to rectified voltage detection circuit 106 of FIG. 1. Section 202 of rectified voltage detection circuit 200 measures a rectified voltage of the AC voltage that is powering the board. ADC 110 of controller 104 (as depicted in FIG. 1) detects the output voltage at point 204 of section 202 of the rectified voltage detection circuit 200. In some embodiments, section 202 of the rectified voltage detection circuit 200 is configured to detect a scaled version of the rectified AC voltage. In such embodiments, ADC 110 of controller 104 detects the rectified AC voltage from section 202 of the rectified voltage detection circuit 200.

FIG. 2B depicts a self-injection test circuit 250. Self-injection test circuit 250 is similar to self-injection test circuit 108 of FIG. 1 and is electrically coupled to current transformer 102 via connection 258. The self-injection test circuit 250 includes a transistor 256. A drain terminal of the transistor 256 is connected to current transformer via connection 258. A source terminal of the transformer is connected to Vin 260 via resistor R36 and a gate terminal of the transformer is connected to controller 104 via resistor R39. In some embodiments, the controller 104 instructs the self-injection test circuit 250 to initiate a calibration of a ground-fault threshold of the current transformer 102 via connection 252. In response to the signal received from the controller 104, the self-injection test circuit injects a half-cycle of AC through the primary of the current transformer 102. The injection of the half-cycle of AC through the current transformer 102 induces the current transformer 102 to generate an output voltage and/or current on the secondary. In some embodiments, the ground fault self-test is performed at 258. A wire goes from point 258 through the primary portion of the current transformer and is connected to ground. When the transistor 256 is turned on using the self-test trigger pulse, the current passes through the current transformer 102 from the rectified voltage measured at 260, through resistor R36 to the current transformer 258. When the value of the rectified voltage at 260 is known, current through the current transformer 102 may be calculated using the formula V=IR, where V is the rectified voltage, and R is the value of resistor R36. In some embodiments, the terminal 260 of FIG. 2B is connected to 202 of rectified voltage detection circuit shown in FIG. 2A.

Figure 3:
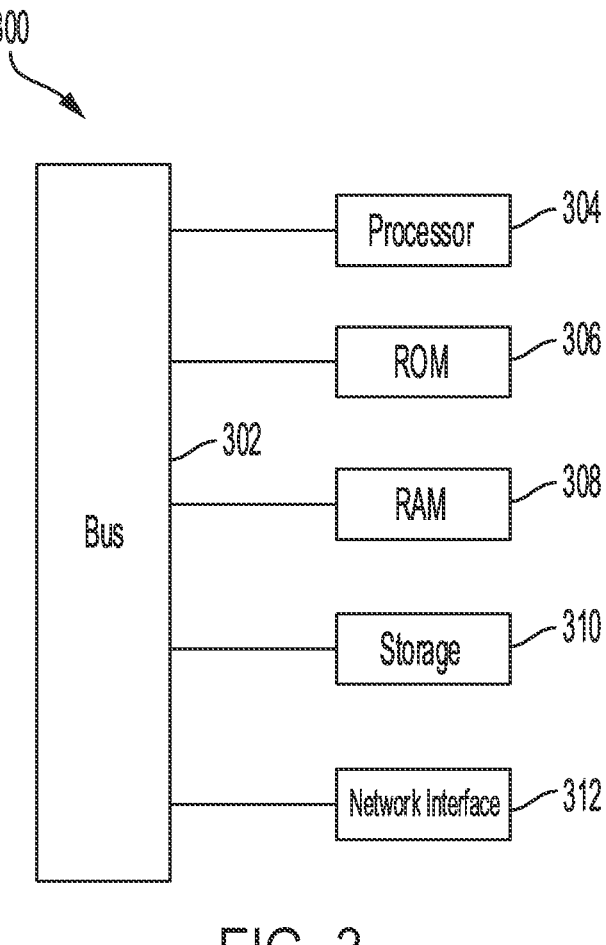
FIG. 3 is a simplified block diagram of one or more devices or systems within the exemplary environment of FIG. 1, according to one or more examples of the present disclosure.

FIG. 3 is a block diagram of an exemplary system or device 300 within the system 100 such as the controller 104. The system 300 includes a processor 304, such as a central processing unit (CPU), and/or logic, that executes computer executable instructions for performing the functions, processes, and/or methods described herein. In some examples, the computer executable instructions are locally stored and accessed from a non-transitory computer readable medium, such as storage 310, which may be a hard drive or flash drive. Read Only Memory (ROM) 306 includes computer executable instructions for initializing the processor 304, while the random-access memory (RAM) 308 is the main memory for loading and processing instructions executed by the processor 304. The network interface 312 may connect to a wired network or cellular network and to a local area network or wide area network. The system 300 may also include a bus 302 that connects the processor 304, ROM 306, RAM 308, storage 310, and/or the network interface 312. The components within the system 300 may use the bus 302 to communicate with each other. The components within the system 300 are merely exemplary and might not be inclusive of every component within the controller 104. Additionally, and/or alternatively, the system 300 may further include components that might not be included within every entity of system 100. For instance, in some examples, the controller 104 might not include a network interface 312.

FIG. 4 illustrates an exemplary process for calibrating a ground-fault threshold, according to one or more examples of the present disclosure. The process 400 may be performed by the controller 104 of system 100 shown in FIG. 1. However, it will be recognized that any of the following blocks may be performed in any suitable order and that the process 400 may be performed in any environment and by any suitable computing device and/or controller.

At block 402, the controller 104 provides, using a self-injection circuit, a trigger pulse as an input to the self-injection circuit. For example, the controller 104 may instruct the self-injection test circuit 108 to inject a half-cycle of AC to the current transformer 102 to initiate a calibration of ground-fault threshold of the current transformer 102. For example, the controller 104 may provide a self-trigger pulse to instruct the transistor in the self-test injection circuit to turn on for one half cycle. Once the transistor is turned on, the current path from the rectified voltage 260 through R36 and through the wire connection 258 to the current transformer 102 is complete. The value of the current in this path can be calculated based on the value of the rectified voltage at 260 and the value of resistor R36.

At block 404, the controller 104 measures a rectified voltage, wherein the rectified voltage is based on an AC voltage powering the circuit board. Controller detects output voltage from the rectified voltage detection circuit. This will allow controller 102 to calculate rectified voltage.

At block 406, the controller 104 determines an expected current through the current transformer, based on the output voltage. For example, the controller 104, detects the output voltage from the rectified voltage detection circuit 106 and converts the output voltage to an expected current through the current transformer 102 using basic engineering principles. In some embodiments, the rectified voltage measured by the rectified voltage detection circuit is present across R36 in the self-test injection circuit as shown in FIG. 2B. When the current flows through the current transformer 102 in response to the self-test trigger pulse being initiated, the controller 102 can calculate the exact current through the current transformer 102 using the formula Voltage (V)=current (I)×resistance (R), where the voltage is the rectified voltage, and the resistance is the value of resistor R36.

At block 408, the controller 104 converts the expected current to a digital value using an analog to digital converter. For example, an ADC 110 of the controller 104 may convert the current from self-test injection circuit is known and controller 102 uses to extrapolate it for 5 mA. This LSB value of the ground fault threshold is saved in the memory.

At block 410, the controller 104 determines a tolerance level of the transformer based on the digital value. For example, the controller 104 normalizes the expected LSB count to a normalized LSB count corresponding to an expected current value of 5 mA. This normalized LSB count is then set as a ground fault threshold of the circuit board comprising of current transformer 102 and a signal path associated with it. In some examples, multiple normalized LSB counts are performed for different injections of half-cycles through the current transformer 102, and a root-mean-square value of the different thresholds is performed to determine a ground fault threshold of the circuit board. Every time the circuit is powered up, the value of the ground fault current as detected by the current transformer is converted to an LSB value and compared to the determined ground fault threshold.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A system for calibrating ground fault threshold using auto-monitoring circuit, the system comprising:
   a circuit board comprising a self-injection circuit, the current transformer, a rectified voltage detection circuit, and a controller configured to:
      provide, using the self-injection circuit, a trigger pulse as input to the self-injection circuit;
      measure, using the rectified voltage detection circuit, a rectified voltage, wherein the rectified voltage is based on an AC voltage powering the circuit board;
      determine an expected current through the current transformer, based on the rectified voltage and a series resistor in a current path;
      convert the expected current to a digital value using an analog to digital converter; and
      determine a tolerance level of the current transformer based on the digital value.

2. The system of claim 1, wherein the controller is further configured to:
   determine a ground fault current value after the circuit board is powered on;
   compare the tolerance level of the current transformer to the determined ground fault current value; and
   provide a trip signal to trip a circuit breaker by actuating a solenoid based on the comparison.

3. The system of claim 2, wherein converting the expected current to a digital value comprises calculating a least significant bit (LSB) count associated with the output current.

4. The system of claim 3, wherein determining the tolerance level of the current transformer comprises:
   determining a unitary LSB count associated with one milliampere of expected current; and
   determining a tolerance LSB associated with five milliamperes of expected current based on the unitary LSB count.

5. The system of claim 4, wherein the controller is configured to provide the trip signal to trip the circuit breaker by actuating the solenoid upon detecting an LSB count greater than the tolerance LSB count.

6. The system of claim 1, wherein the expected current is current that goes through a primary of the current transformer is considered as a leakage based on determining that the expected current does not return through the current transformer.

7. The system of claim 1, wherein the trigger pulse comprises a half-cycle of alternating current (AC).

8. The system of claim 1, wherein the trigger pulse is applied at regular time intervals.

9. The system of claim 1, wherein calculating the tolerance level of the current transformer comprises calculating a room-mean-square tolerance value using multiple determined tolerance levels.

10. The system of claim 1, wherein the self-injection circuit comprises a rectifier and a bipolar junction transistor, and wherein the current transformer is connected to a source terminal of the bipolar junction transistor and the rectifier is connected to a drain terminal of the bipolar junction transistor.

11. A method for calibrating ground fault threshold using auto-monitoring circuit on a circuit board, the method comprising:
   providing, using a self-injection circuit, a trigger pulse input to the self-injection circuit;
   measuring a rectified voltage, wherein the rectified voltage is based on an AC voltage powering the circuit board;
   determining an expected current through the current transformer, based on the rectified voltage and series resistor in a current path;
   converting the expected current to a digital value using an analog to digital converter; and
   determining a tolerance level of the current transformer based on the digital value.

12. The method of claim 11, further comprising:
   determining a ground fault current value after the circuit board is powered on;
   comparing the tolerance level of the current transformer to the determined ground fault current value; and
   provide a signal to trip the current transformer based on the comparison.

13. The method of claim 12, wherein converting the expected current to a digital value comprises calculating a least significant bit (LSB) count associated with the output current.

14. The method of claim 13, wherein determining the tolerance level of the current transformer comprises:
   determining a unitary LSB count associated with one milliampere of expected current; and
   determining a tolerance LSB associated with five milliamperes of expected current based on the unitary LSB count.

15. The method of claim 14, wherein the controller is configured to provide the signal to trip the current transformer upon detecting an LSB count greater than the tolerance LSB count.

16. The method of claim 11, wherein the expected current is current that goes through a primary of the current transformer is considered as a leakage based on determining that the expected current does not return through the current transformer.

17. The method of claim 11, wherein the trigger pulse comprises a half-cycle of alternating current (AC).

18. The method of claim 11, wherein the trigger pulse is applied at regular time intervals.

19. The method of claim 11, wherein calculating the tolerance level of the current transformer comprises calculating a room-mean-square tolerance value using multiple determined tolerance levels.

20. A non-transitory computer-readable medium having processor-executable instructions stored thereon, wherein the processor-executable instructions, when executed by one or more processors, facilitate:

providing, using a self-injection circuit, a trigger pulse input to the self-injection circuit;

detecting an output voltage from the current transformer;

determining an expected current through the current transformer, based on the rectified voltage;

converting the expected current to a digital value using an analog to digital converter; and determining a tolerance level of the current transformer based on the digital value.

* * * * *